United States Patent [19]
Wik et al.

[11] Patent Number: 5,796,650
[45] Date of Patent: Aug. 18, 1998

[54] MEMORY CIRCUIT INCLUDING WRITE CONTROL UNIT WHEREIN SUBTHRESHOLD LEAKAGE MAY BE REDUCED

[75] Inventors: Thomas R. Wik, Livermore; Shahryar Aryani, San Jose, both of Calif.

[73] Assignee: LSI Logic Corporation, Milpitas, Calif.

[21] Appl. No.: 858,270

[22] Filed: May 19, 1997

[51] Int. Cl.$^6$ ...................................................... G11C 7/00
[52] U.S. Cl. ...................... 365/150; 365/174; 365/189.01
[58] Field of Search ..................................... 365/150, 149, 365/174, 189.01

[56] References Cited

U.S. PATENT DOCUMENTS

| | | |
|---|---|---|
| 5,285,414 | 2/1994 | Yamauchi et al. ...................... 365/203 |
| 5,414,656 | 5/1995 | Kenney .................................... 365/203 |

*Primary Examiner*—Vu A. Le
*Attorney, Agent, or Firm*—Conley, Rose & Tayon; B. Noel Kivlin

[57] ABSTRACT

A memory circuit wherein subthreshold leakage current may be reduced. The memory circuit includes a memory array composed of one or more storage cells that are each configured to store a memory value on a storage transistor. The storage cells further include a write transistor coupled to the storage transistor that is configured to allow data driven on a write bit line to be stored to the storage transistor. The write bit line is coupled to a write control unit, which includes a buffer and a offset voltage element. The buffer is configured to establish an output voltage on the write bit line in response to an input voltage. The offset voltage element is coupled to the buffer, and is configured to offset the output voltage on the write bit line by a predetermined amount. In one implementation of the write control unit, the buffer is formed by an inverter that includes a p-channel and an n-channel transistor. The offset voltage element is a diode-connected transistor coupled between the inverter and ground. The diode-connected transistor has the effect of holding the write bit line at a level equal to its threshold voltage when the n-channel transistor of the inverter is active. In another implementation, the buffer is also an inverter that includes a p-channel and an n-channel transistor. The offset voltage element is a pullup transistor that is active when the n-channel transitor of the inverter is active. The pullup transistor forms a voltage divider with the n-channel transistor, such that the voltage between the write bit line and ground is offset by an amount determined by the voltage drop across the pullup transistor. The offset voltage established by the write control unit biases the write transistor such that subthreshold leakage current may be reduced when the write transistor is off.

20 Claims, 3 Drawing Sheets

MEMORY CIRCUIT INCLUDING WRITE CONTROL UNIT WHEREIN SUBTHRESHOLD LEAKAGE MAY BE REDUCED

BACKGROUND OF THE INVENTION

1. Field of the Invention

This invention relates to the field of digital electronic memory devices, and in particular to memory circuits wherein subthreshold leakage current in a dynamic random-access memory cell may be reduced.

2. Description of the Related Art

Memory devices are used in digital computer systems to store and retrieve electronic data at high speeds. Each item of data in memory, called a bit, is stored in a separate circuit or device known as a cell. Since computers use binary format to represent data, each cell can store one of two possible values (on or off). A typical memory system contains millions of bits organized as an array consisting of horizontal rows and vertical columns. Each cell shares electrical connections with the other cells in its row and column. The horizontal lines connected to all cells in a row are called word lines, and the vertical lines (along which data flows into and out of the cell) are called data or bit lines. Cells are therefore accessed by proper selection of the word and bit lines.

Several different types of memory are found in digital computers, one of which is dynamic random access memory (DRAM). Random-access memory is flexible in that it allows both the retrieval and storage of data to be performed quickly (as compared to Read-only Memory, or ROM). Dynamic RAM differs from static RAM (SRAM) in that it stores a value in a memory cell by either charging or discharging a capacitor. The cell retains its value only as long as the capacitor remains charged (typically a few milliseconds). Therefore, the capacitor in the cell needs to be periodically recharged, or refreshed. SRAMs, on the other hand, retain a value in a cell until either another value is stored or the power supply is interrupted.

DRAMs, while typically slower than SRAMs, are less expensive and are generally used to implement large arrays in a computer system, such as main memory. DRAMs are less expensive than SRAMs because their memory cells are designed to be as simple as possible. Sacrificing circuitry for compactness, though, results in a less robust output signal from the cell. Peripheral logic such as sense amplifiers, memory registers, and output drivers is needed to properly restore the electrical characteristics of the cell's output to be compatible with the rest of the system. Another disadvantage of DRAM cells is the necessity of the refresh operation, in which data from each cell in the memory is read and re-written to the cell to restore the charge. Refreshing increases the power consumption of the memory system, as well as increasing the average access time of the memory. Memory cells are typically not available to be read or written during the refresh operation. Reliability is also an issue when dealing with a dynamically stored value. Some memory cells may contain weak bit cells, where the storage element discharges too quickly, resulting in a loss of data (assuming no error correcting circuitry is employed).

One compact DRAM design is the three-transistor memory cell (3T cell). The 3T cell includes a storage transistor, which maintains the value of the cell, a read transistor for retrieving the value of the cell, and a write transistor, for storing a value into the cell. One type of transistor that can be used to implement the 3T cell is the Metal-Oxide-Silicon Field-Effect Transistor (MOSFET). A MOSFET has a gate terminal separated from a silicon substrate by a thin layer of insulating material. Furthermore, the MOSFET has a channel extending between two diffused regions in the substrate, called the source terminal and the drain terminal. The fourth terminal, the substrate, is typically held at a non-conducting voltage. The source and drain are electrically disconnected unless a voltage potential from the transistor's gate to its source ($V_{GS}$) surpasses a threshold voltage ($V_T$) characteristic of the transistor. In this case, current begins to flow between the source and drain. When $V_{GS}$ is less than $V_T$, the current flowing in the channel (known as the subthreshold leakage current) is considerably smaller than when $V_{GS}$ is greater than $V_T$.

To understand the causes of subthreshold leakage current, the structure and operation of a MOSFET must be considered. The source and drain terminals of the transistor each form a reverse-biased junction with the substrate. At values of $V_{GS}$ below $V_T$, these terminals are electrically disconnected from one another. At each of these junctions, one side of the junction has more positive charge carriers, and the other has more negative carriers. This heavy concentration of charge carriers is called doping. (In an n-channel transistor, the source and drain are negatively doped, and the substrate is positively doped). When these two regions come into contact, the differing charge concentrations cause a flow of negative carriers to the positively-charged region and a flow of positive carriers to negatively-charge region. As the carriers move about, an electric field is built up between the two regions. Eventually, an equilibrium is reached where the electric field exactly balances the tendency of the charge carriers to migrate. A potential barrier is thus erected between the two types of materials that prevents current from flowing. Furthermore, a region is built up at the junction that is almost entirely devoid of any charge carriers. This area is known as the depletion region.

In large geometry MOSFETs, the potential barrier across the depletion region is great enough to restrict most leakage current. The electric fields created by the source-substrate junction and the drain-substrate junction are far enough part so that one field does not sufficiently lower the barrier enough to produce current injection. This is true even as drain voltage ($V_D$) is increased, for in long-channel devices, the leakage current is substantially independent of the drain-source voltage $V_{DS}$.

In short-channel transistors, however, an effect called drain-induced barrier lowering (DIBL) becomes important. DIBL results when the drain is sufficiently close to the source, such that the electric field caused by the drain-substrate junction lowers the source barrier enough so that current will flow. There are two components to DIBL. First, even if $V_{DS}$ is zero, the channel might be short enough such that there is overlap between the depletion regions of the drain and source terminals. This effect by itself may be enough to induce current flow. Secondly, as $V_{DS}$ is increased, the electric field of the drain junction may extend into the source region, again lowering the potential barrier. The subthreshold leakage current also has an exponential dependence on $V_G$ (and hence, $V_{GS}$). As $V_{GS}$ increases, attracting more charge carriers to the channel, more current will flow.

In large geometry MOSFETs (channel lengths greater than one micron), the subthreshold leakage current is usually small enough to be ignored. For short-channel devices, however, this current flow may, in many instances, be significant. In the 3T cell, in which the write transistor is connected to the gate of the storage transistor, the subthreshold leakage current through the write transistor is a primary factor in the rate of discharge of the storage transistor. This discharge has an effect on both the refresh time and the reliability of the 3T cell. To improve performance, it would therefore be desirable to have a means of reducing the subthreshold leakage current through the write access transistor of a 3T memory cell.

SUMMARY OF THE INVENTION

The problems outlined above are in large part solved by a memory circuit in accordance with the present invention. In one embodiment, a memory circuit is provided wherein subthreshold leakage current may be reduced. The memory circuit includes a memory array composed of one or more storage cells that are each configured to store a memory value on a storage transistor. The storage cells further include a write transistor coupled to the storage transistor that is configured to allow data driven on a write bit line to be stored to the storage transistor. The write bit line is coupled to a write control unit, which includes a buffer and a offset voltage element. The buffer is configured to establish an output voltage on the write bit line in response to an input voltage. The offset voltage element is coupled to the buffer, and is configured to offset the output voltage on the write bit line by a predetermined amount. In one implementation of the write control unit, the buffer is formed by an inverter that includes a p-channel and an n-channel transistor. The offset voltage element is a diode-connected transistor coupled between the inverter and ground. The diode-connected transistor has the effect of holding the write bit line at a level equal to its threshold voltage when the n-channel transistor of the inverter is active. In another implementation, the buffer is also an inverter that includes a p-channel and an n-channel transistor. The offset voltage element is a pullup transistor that is active when the n-channel transitor of the inverter is active. The pullup transistor forms a voltage divider with the n-channel transistor, such that the voltage between the write bit line and ground is offset by an amount determined by the voltage drop across the pullup transistor. The offset voltage established by the write control unit biases the write transistor such that subthreshold leakage current may be reduced when the write transistor is off.

Broadly speaking, the present invention contemplates a memory circuit including at least one storage cell configured to store a memory value on a storage node formed by a capacitance coupled to the storage node. Each of the cells further includes a write transistor configured to cause write data driven on a write bit line to be written to the storage node. The memory circuit further includes a write control unit coupled to the write bit line and a first reference voltage. The write control unit includes a buffer coupled to the write bit line, and an offset voltage element coupled to the buffer. The buffer is configured to convey a first output voltage on the write bit line in response to a first input voltage, thereby establishing a first output logic state. The offset voltage element is configured to cause the first output voltage to be offset from the first reference voltage by an amount determined by an offset voltage established across the offset voltage element.

The present invention further contemplates a memory circuit including at least one three-transistor memory cell configured to store a memory value on a capacitance formed by a storage transistor and a first reference voltage. The three-transistor memory cell further includes a write transistor and a read transistor, both of which are coupled to the storage transistor. The write transistor is further coupled to a write bit line, and is configured to convey write data on said write bit line to be written to said storage transistor. The read transistor is further coupled to a read bit line, and is configured to cause the memory value stored in the cell to be conveyed on the read bit line. The memory circuit further includes a write control unit coupled to the write bit line and the first reference voltage. The write control unit includes a buffer coupled to the write bit line. The buffer is configured to convey a first output voltage on the write bit line in response to a first input voltage, thereby establishing a first output logic state. The write control unit further includes an offset voltage element coupled to the buffer, such that the first output voltage is offset from the first reference voltage by an amount determined by an offset voltage established across the offset voltage element.

BRIEF DESCRIPTION OF THE DRAWINGS

Other objects and advantages of the invention will become apparent upon reading the following detailed description and upon reference to the accompanying drawings in which.

Figure 1:
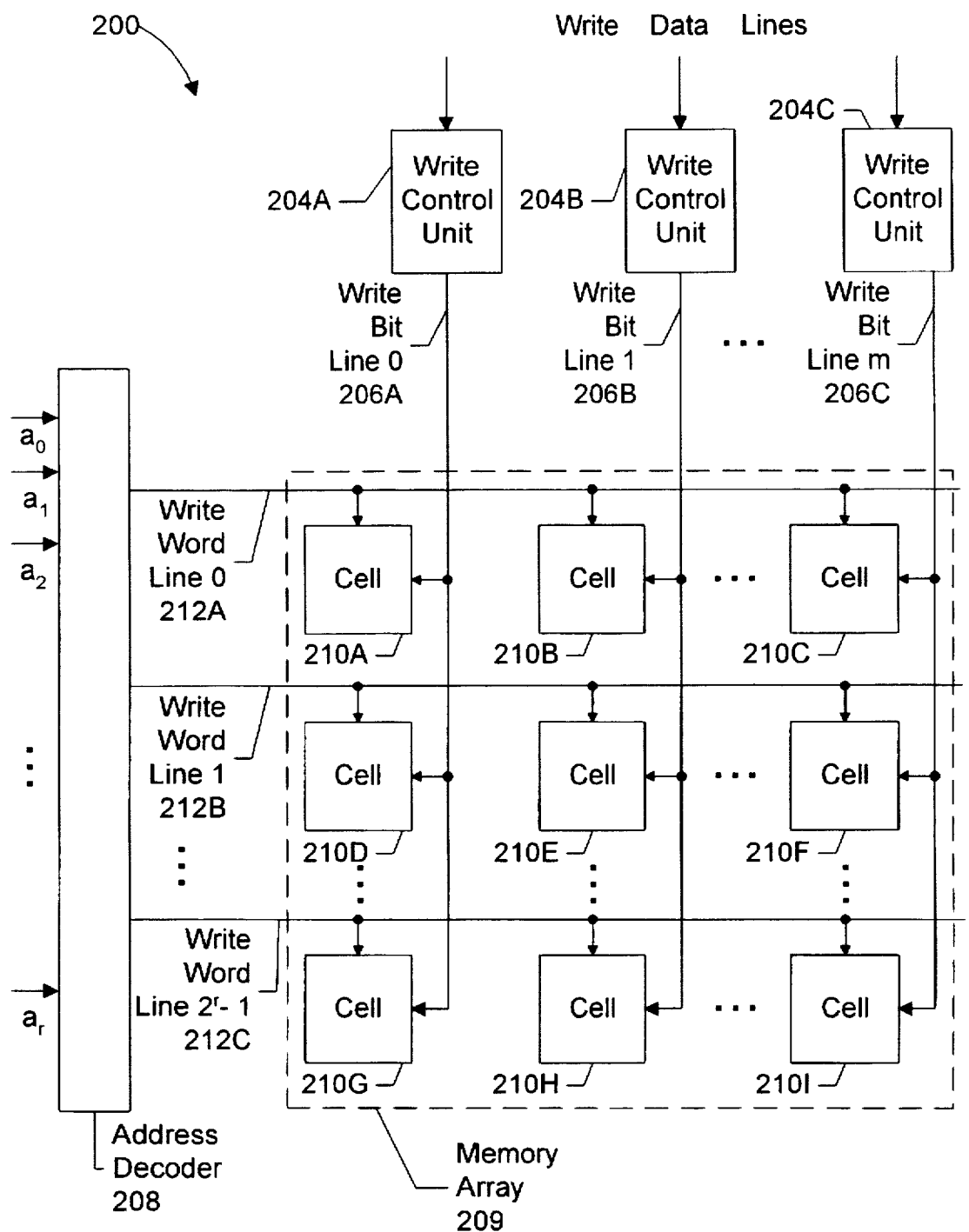
FIG. 1 depicts a memory circuit including a memory array and a write control unit according to one embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a block diagram of a memory circuit 200 including a memory array 209 and a plurality of write control units 204A–C in accordance with one embodiment of the present invention is shown. As depicted, memory circuit 200 includes a plurality of cells 210A–210I (referred to collectively as cells 210) which make up memory array 209. The memory array 209 is coupled to address decoder 208 by write word lines 212A–212C. The memory array is also coupled to write control units 204A–204C by write bit lines 206A–206C. The write control units 204A–204C receive write data lines as their respective inputs.

During operation of memory circuit 200, values may be selectively stored into cells 210A–210I within memory array 209 by signals provided by address decoder 208 and write control units 204A–204C. Specifically, inputs to address decoder 208 typically select a single row of cells in memory array 209 by activating one of the write word lines 212A–212C. The value that each of the write control units 204A–C is driving on its respective write bit line 206A–C is then written to its respective memory cell 210A–I. For example, inputs to address decoder 208 may select write word line 210A to access the row in memory array 209 containing cells 210A–210C. When write word line 212A is active, the value on write bit line 206A will be written to cell 210A, the value on write bit line 206B will be written to cell 210B, and the value on write bit line 206C will be written to cell 210C. Circuitry for reading the contents of cells 210A–210I may further be coupled to memory array 209 but is not specifically shown herein for simplicity. As will be described in further detail below, the voltages on write bit lines 206A–206C are advantageously controlled to minimize the leakage of the stored value in each cell 210 through the corresponding write transistor when the write transistor is off.

Figure 2:
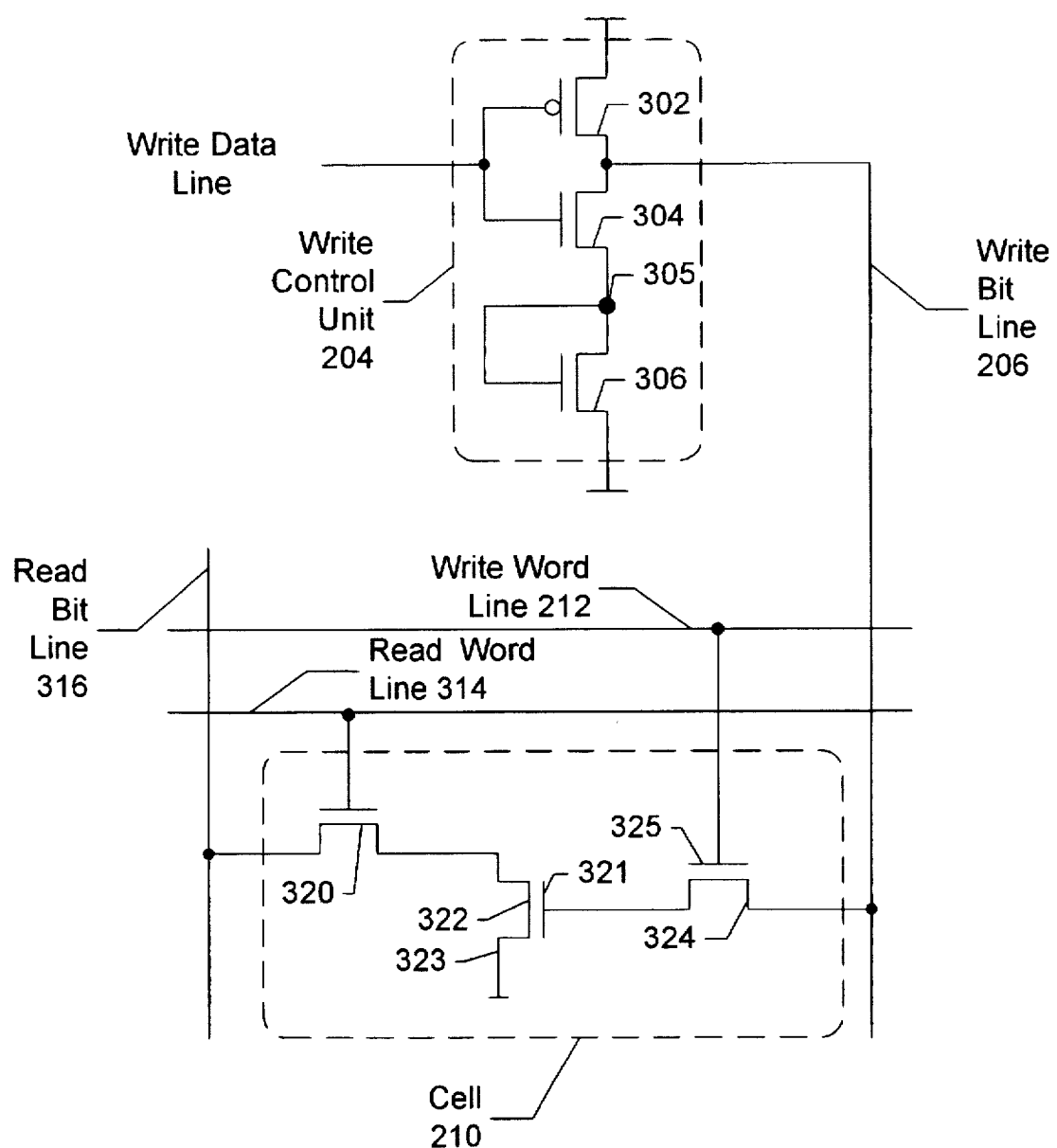
FIG. 2 shows one implementation of a write control unit and a memory cell in accordance with one embodiment of the present invention.

Turning now to FIG. 2, portions of one embodiment of circuitry within memory circuit 200 are shown in greater detail. Circuit portions corresponding to those of FIG. 2 are numbered identically for simplicity and clarity. FIG. 2 shows cell 210, which is exemplary of cells 210A–I. Cell 210 includes a read transistor 320, a storage transistor 322, and a write transistor 324. Cell 210 is connected to a write word line 212, a read word line 314, a write bit line 206, and a read bit line 316. Write bit line 206 is driven by a write control unit 204, which includes an inverter formed by p-channel transistor 302 coupled to a logic high reference voltage and n-channel transistor 304. A diode-connected transistor 306, with its gate and drain tied together at node 305, is coupled between transistor 304 and ground.

Cell 210 is one implementation of a three-transistor DRAM cell (3T cell). In this embodiment, a value is stored into the cell 210 by activating write word line 212. The write word line 212 turns on the cell's write transistor 324, which causes the value on write bit line 206 to be conveyed to the storage transistor 322. The value in cell 210 is stored as a capacitance between the gate 321 and source 323 of storage transistor 322. To read the contents of cell 210, read bit line 316 is first precharged to a logic high level. Next, read word line 314 is activated, turning on read transistor 320. If a logic high value is stored at gate 321 of storage transistor 322, the storage transistor will also be turned on. In this case, the read bit line will begin to discharge as current flows through the read transistor 320 and the storage transistor 322 to ground. Sense amplifiers (not shown) connected to read bit line 316 detect this drop in voltage and convey a logic high voltage as output. Conversely, if a logic low value is stored at gate 321 of storage transistor 322, the storage transistor will be turned off. In this case, the read bit line has no path to discharge. The sense amplifiers (not shown) connected to read bit line 316 detect the lack of a voltage drop, and convey a logic low voltage as output. Additional circuitry to implement the refresh function for cell 210 is not shown. When cell 210 is being refreshed, it cannot be read or written as usual. The refresh logic reads the contents of cell 210, and instead of conveying this value as output, it rewrites this value back to storage transistor 322, thereby restoring the charge.

Write control unit 204 controls the values conveyed on write bit line 206. When a logic low voltage is received on the write data line, transistor 304 is turned off, and transistor 302 is turned on. Transistor 302 conveys a logic high reference voltage on write bit line 206 to cell 210. If this value is driven in accordance with write word line 212, a logic high will be stored in cell 210. When a logic high voltage is received on the write data line, transistor 302 is turned off and transistor 304 is turned on. Transistor 306, with its drain connected to its gate, holds the write bit line 206 at a voltage equal to its threshold voltage. If transistor 306 was not present in the circuit, and transistor 304 were turned on, current would begin to drain from the output (which in this case is the value stored on the gate of storage transistor 322 in the 3T cell) until the write bit line reached ground potential. With transistor 306 coupled between transistor 304 and ground, however, a different scenario occurs. Current begins to drain from the gate of storage transistor 322, as above. It flows through transistor 304 to the drain of transistor 306. No current can flow through transistor 306, however, until $V_G=V_D=V_T$. Eventually, node 305 reaches a voltage equal to $V_T$. At this point, transistor 306 begins to turn on. When it begins to conduct current, the voltage at the drain (and hence, the gate) will then fall below $V_T$, cutting off further current flow. In effect, the configuration of transistor 306 as an offset voltage element keeps write bit line 206 clamped at a level $V_T$. When driven in accordance with write word line 212, this voltage will be stored in cell 210 as a logic low value. Write bit line 206 will continue to be held at $V_T$ even after write transistor 324 is turned off.

When write transistor 324 is off, $V_G$ is typically held at 0 V, or ground. By offsetting write bit line 206 to a voltage $V_T$ (thus causing $V_s$ to equal $V_T$), $V_{GS}$ of write transistor 324 becomes negatively biased. This leads to an exponential reduction in leakage current through write transistor 324 when it is off. In one embodiment of cell 210, $V_T=0.49$ V, and a 70 mv increase in $V_s$ will reduce the leakage by an order of magnitude. Driving the write bit line at 1 $V_T$ will therefore reduce the leakage current by a factor of $10^{(0.49V/0.07V)}$, or $10^7$.

Note that the voltage driven on write bit line 206 will also be stored in cell 210 to indicate a logic low level. When doing this, it is imperative that the margin for a stored low not be compromised. While the offset voltage on write bit line 206 must be high enough to reduce leakage current, it must not be so high that the read circuitry does not recognize the voltage as a logic low.

By controlling the value on write bit line 206 when write transistor 324 is off, the subthreshold leakage current through write transistor 324 may be advantageously reduced. By restricting the leakage, the standby power dissipation of the transistor is thereby decreased. This has the effect of decreasing the necessary refresh rate for the cell (since it holds charge longer, it does not need to be refreshed as often). A reduction in leakage also increases the reliability of a cell at a given refresh rate.

Figure 3:
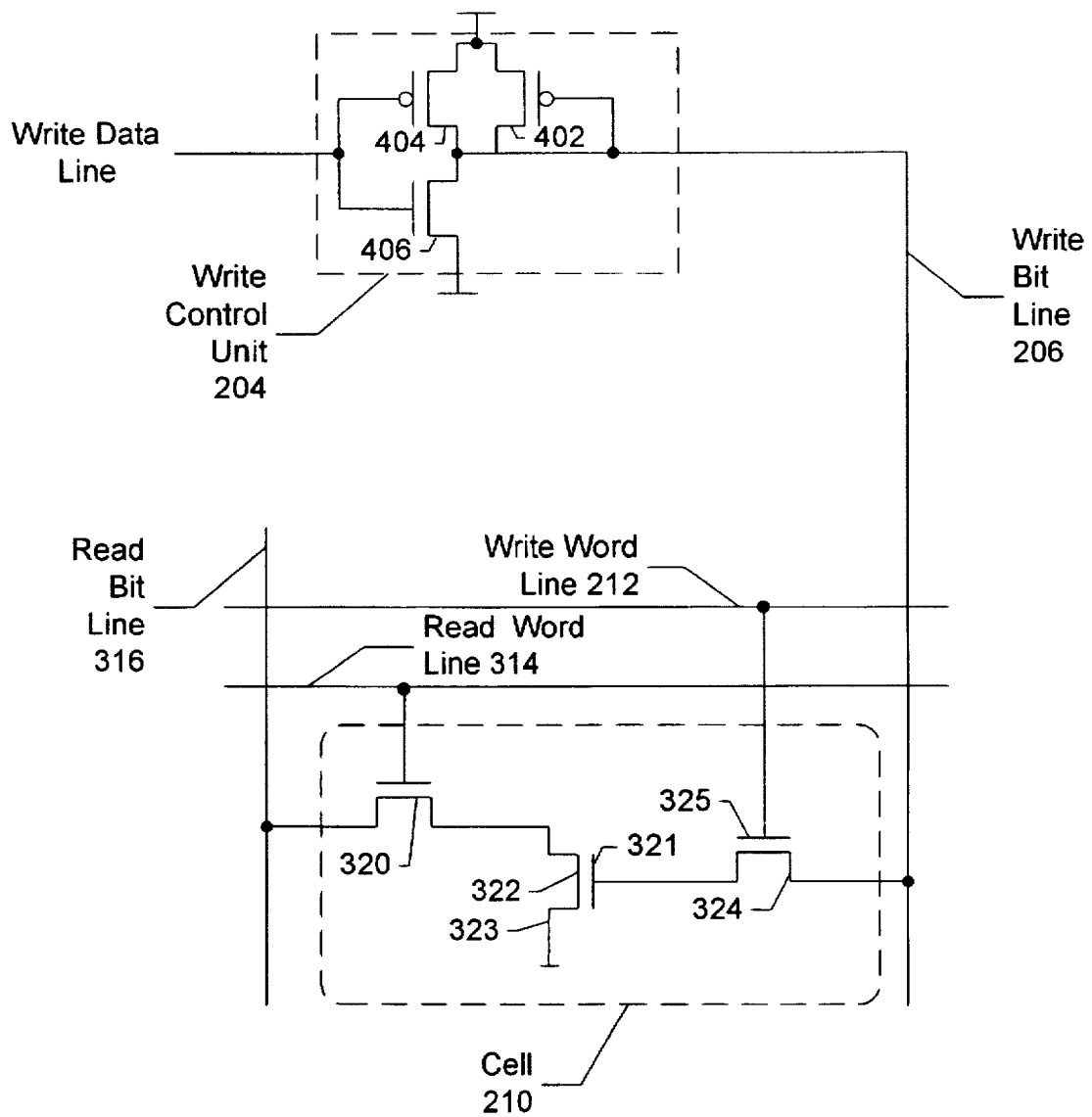
FIG. 3 shows a different implementation of a write control unit and a memory cell in accordance with one embodiment of the present invention.

Turning next to FIG. 3, another embodiment of portions of memory circuit 200 is shown. Circuit portions identical to those of FIGS. 1 and 2 are numbered identically for simplicity and clarity. FIG. 3 shows cell 210, which includes a read transistor 320, storage transistor 322, and write transistor 324. Write transistor 324 is coupled to write word line 212 and write bit line 206. Read transistor 320 is coupled to read word line 314 and read bit line 316. Write control unit 204 includes an inverter with p-channel transistor 404 and n-channel transistor 406, and a pullup transistor 402. Write control unit 204 receives write input and conveys an output on write bit line 206.

Write control unit 204 operates similarly to the embodiment shown in FIG. 2, differing only in how the offset voltage on write bit line 206 is achieved. When a logic low voltage is received on the write data line, transistor 404 is turned on and transistor 406 is turned off. In this manner, a logic high reference voltage is conveyed on write bit line 206, which serves to keep pullup transistor 402 in the off state. When a logic high voltage is received on the write data line, transistor 404 is turned off and transistor 406 is turned on. This causes a logic low voltage to be conveyed on write bit line 206, which activates pullup transistor 402. A voltage divider network is thus formed by transistors 402 and 406. Transistor 402 can thus be advantageously sized in relation to transistor 406 to provide the proper voltage drop from write bit line 206 to ground. This establishes the logic low voltage at an offset above ground as in the write control unit shown in FIG. 2 and described above.

It is noted that other embodiments of write control unit 204 may be employed. For example, while an inverting buffer formed by transistors 302 and 304 is shown in FIGS. 2 and 3, a non-inverting buffer may also be used. Additionally, the use of any offset voltage element in place of transistor 306 in FIG. 2 may also be utilized.

Numerous variations and modifications will become apparent to those skilled in the art once the above disclosure is fully appreciated. It is intended that the following claims be interpreted to embrace all such variations and modifications.

What is claimed is:

1. A memory circuit comprising:
   a memory array including at least one storage cell configured to store a memory value on a storage node formed by a capacitance coupled to said storage node, wherein said at least one storage cell includes a write transistor configured to cause write data driven on a write bit line to be written to said storage node; and
   a write control unit coupled to said write bit line and a first reference voltage, wherein said write control unit includes:
      a buffer coupled to said write bit line, wherein said buffer is configured to convey a first output voltage on said write bit line in response to a first input voltage, and wherein said first output voltage establishes a first output logic state; and
      an offset voltage element coupled to said buffer, wherein said offset voltage element is configured to cause said first output voltage to be offset from said first reference voltage by an amount determined by an offset voltage established across said offset voltage element.

2. The memory circuit as recited in claim 1 wherein said buffer is coupled to a second reference voltage, and wherein said buffer is further configured to convey a second output voltage on said write bit line in response to a second input voltage, and wherein said second output voltage establishes a second output logic state.

3. The memory circuit as recited in claim 2 wherein said buffer includes a first transistor and a second transistor, wherein said first transistor is configured to turn on in response to said first input voltage, and wherein said second transistor is configured to turn on in response to said second input voltage.

4. The memory circuit as recited in claim 1 wherein said storage node is formed by a storage transistor.

5. The memory circuit as recited in claim 4 wherein said capacitance is formed between a gate of said storage transistor and a source of said storage transistor.

6. The memory circuit as recited in claim 5 wherein said first output voltage is offset from said first reference voltage by approximately a threshold voltage level associated with said storage transistor.

7. The memory circuit as recited in claim 1 further includes an address decoder coupled to said memory array.

8. The memory circuit as recited in claim 1 wherein a source of said write transistor and a drain of said write transistor are coupled between said write bit line and said gate of said storage transistor.

9. The memory circuit as recited in claim 8 further includes a write word line coupled to a gate of said write transistor, wherein said write word line is configured to turn on and off said write transistor.

10. The memory circuit as recited in claim 9 further includes a read transistor, wherein said read transistor is coupled between a drain of said storage transistor and a read bit line, and wherein said read transistor is configured to cause a voltage discharge on said read bit line, wherein said read bit line conveys a voltage corresponding to said memory value in response to said voltage discharge.

11. The memory circuit as recited in claim 10 further includes a read word line connected to a gate of said read transistor, wherein said read word line is configured to turn on and off said read transistor.

12. The memory circuit as recited in claim 1 wherein said offset voltage element includes a transistor coupled between said buffer and said first reference voltage.

13. The memory circuit as recited in claim 12, wherein said transistor is a diode-connected transistor, wherein a gate of said diode-connected transistor is coupled to a drain of said diode-connected transistor.

14. The memory circuit as recited in claim 13, wherein said offset voltage equals a threshold voltage level of said diode-connected transistor.

15. The memory circuit as recited in claim 3 wherein said offset voltage element is formed by a pullup transistor coupled to said second reference voltage, wherein said pullup transistor is configured to be active during times at which said first transistor is on, and wherein said offset voltage is determined by the voltage established across said first transistor during times at which said first transistor and said pullup transistor are both on.

16. A memory circuit comprising:
   a memory array including at least one three-transistor memory cell wherein said three-transistor memory cell is configured to store a memory value on a capacitance formed by a storage transistor and a first reference voltage, and wherein said storage transistor is coupled between a write transistor and a read transistor, and wherein said write transistor is further coupled to a write bit line, and wherein said write transistor is configured to convey write data on said write bit line to be written to said storage transistor, and wherein said read transistor is further coupled to a read bit line, wherein said read transistor is configured to cause said memory value to be conveyed on said read bit line; and
   a write control unit coupled to said write bit line and said first reference voltage, wherein said write control unit includes:
      a buffer coupled to said write bit line, wherein said buffer is configured to convey a first output voltage on said write bit line in response to a first input voltage, and wherein said first output voltage establishes a first output logic state; and
      an offset voltage element coupled to said buffer, wherein said offset voltage element is configured to cause said first output voltage to be offset from said first reference voltage by an amount determined by an offset voltage established across said offset voltage element.

17. The memory circuit as recited in claim 16 wherein said buffer is coupled to a second reference voltage, and wherein said buffer is further configured to convey a second output voltage on said write bit line in response to a second input voltage, and wherein said second output voltage establishes a second output logic state.

18. The memory circuit as recited in claim 17 wherein said buffer includes a first transistor and a second transistor, wherein said first transistor is configured to turn on in response to said first input voltage, and wherein said second transistor is configured to turn on in response to said second input voltage.

19. The memory circuit as recited in claim 16 wherein said offset voltage element is formed by a diode-connected transistor coupled between said buffer and said reference voltage, wherein a gate of said diode-connected transistor is coupled to a drain of said diode-connected transistor.

20. The memory circuit as recited in claim 19 wherein said offset voltage equals a threshold voltage level of said diode-connected transistor.

* * * * *